(12) United States Patent
Ren

(10) Patent No.: US 9,865,220 B2
(45) Date of Patent: Jan. 9, 2018

(54) GATE DRIVING CIRCUIT AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Hu nan Ren, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 32 days.

(21) Appl. No.: 14/578,239

(22) Filed: Dec. 19, 2014

(65) Prior Publication Data

US 2015/0187320 A1 Jul. 2, 2015

(30) Foreign Application Priority Data

Dec. 31, 2013 (CN) .......................... 2013 1 0754474

(51) Int. Cl.
  *G09G 3/36* (2006.01)
  *H03K 3/012* (2006.01)
  *H03K 17/16* (2006.01)

(52) U.S. Cl.
  CPC ......... *G09G 3/3696* (2013.01); *G09G 3/3677* (2013.01); *H03K 3/012* (2013.01); *H03K 17/161* (2013.01); *G09G 2300/0417* (2013.01); *G09G 2300/0426* (2013.01); *G09G 2310/0286* (2013.01); *G09G 2310/08* (2013.01); *G09G 2330/021* (2013.01)

(58) Field of Classification Search
  None
  See application file for complete search history.

(56) References Cited

U.S. PATENT DOCUMENTS

| 8,164,562 B2 | 4/2012 | Lee et al. |
| 2003/0189542 A1* | 10/2003 | Lee ..................... G09G 3/3648 345/93 |
| 2007/0091044 A1 | 4/2007 | Park et al. |
| 2007/0195920 A1 | 8/2007 | Tobita |

(Continued)

FOREIGN PATENT DOCUMENTS

| CN | 102598144 A | 7/2012 |
| CN | 102708778 A | 10/2012 |

(Continued)

*Primary Examiner* — Alexander Eisen
*Assistant Examiner* — Kebede Teshome
(74) *Attorney, Agent, or Firm* — Anova Law Group, PLLC

(57) ABSTRACT

The present disclosure discloses a gate driving circuit and a display device, to avoid power consumption arising from overlapping of voltages output by the output ends of gate drivers in the case that the gate driving circuit is configured with a plurality of clock signals. The gate driving circuit includes: a plurality of gate scan lines, and N stages of gate drivers connected in cascade. Each stage of gate drivers includes a reset end and an output end, which provides a gate scan signal to a corresponding gate scan lines. The output end of a m-th stage gate driver is connected provides a reset signal to the reset end of a (m−1)-th stage of gate drivers, N and m are positive integers, and m<N.

9 Claims, 9 Drawing Sheets

(56) References Cited

U.S. PATENT DOCUMENTS

| | | | |
|---|---|---|---|
| 2011/0043511 A1* | 2/2011 | Hsueh | G09G 3/3677 345/212 |
| 2011/0310074 A1* | 12/2011 | Ochiai | G09G 3/3674 345/208 |
| 2012/0182050 A1 | 7/2012 | Yang et al. | |
| 2013/0069930 A1* | 3/2013 | Fukaya | G09G 3/3677 345/214 |
| 2013/0136224 A1* | 5/2013 | Qing | G11C 19/28 377/64 |
| 2013/0241813 A1 | 9/2013 | Tanaka | |

FOREIGN PATENT DOCUMENTS

| | | |
|---|---|---|
| CN | 102779493 A | 11/2012 |
| CN | 102915698 A | 2/2013 |
| DE | 19950860 A1 | 5/2000 |

* cited by examiner

GATE DRIVING CIRCUIT AND DISPLAY DEVICE

CROSS-REFERENCES TO RELATED APPLICATIONS

This application claims the benefit of priority to Chinese Patent Application No. 201310754474.0, filed with the Chinese Patent Office on Dec. 31, 2013 and entitled "GATE DRIVING CIRCUIT AND DISPLAY DEVICE", the content of which is incorporated herein by reference in its entirety.

BACKGROUND OF THE INVENTION

A Thin Film Transistor Liquid Crystal Display (TFT-LCD) driver mainly includes a gate driver and a data driver, wherein the gate driver converts input clock signals by a shift register and applies the converted signals to gate lines of a liquid crystal display panel.

As shown in FIG. 1, an Amorphous Silicon Gate (ASG) driving circuit in the related art includes a plurality of cascaded gate drivers, wherein an output end of each gate driver is connected to a corresponding gate line to output a gate driving signal. For the gate driving circuit controlled by the four-phase clock signals in FIG. 1, a Reset signal input end of a n-th stage gate driver is connected with an output end of a (n+2)th stage gate driver, for example, the Reset signal input end of a first-stage gate driver is connected with the output end G3 of the third-stage gate driver. For the gate driving circuit controlled by the eight-phase clock signals in FIG. 2, the Reset signal input end of a n-th stage gate driver is connected with an output end of a (n+4)th stage gate driver.

As shown in FIG. 3, when the ASG circuit is controlled by the eight-phase clock signals, before the Reset signal of each stage is reset, voltages output by the output ends Gate n−3, Gate n−2, Gate n−1 and Gate n of the four adjacent stages of gate drivers are shown in the figure, and there is an overlapping area among the voltages output by the output ends Gate n−3, Gate n−2, Gate n−1 and Gate n of the gate drivers, which results in unnecessary charging of pixel 30, wherein 31 is normal charging of pixel. When the ASG circuit is turned on, liquid crystal molecules are charged and discharged, and energy is consumed during the charging and discharging processes, so unnecessary charging and discharging would lead to consumption of energy.

Therefore, when the gate driving circuit is configured with a plurality of clock signals in the related art, there is an overlapping area among the voltages output by the output ends of the gate drivers, thus leading to unnecessary charging of pixel and consumption of energy.

DETAILED DESCRIPTION OF THE INVENTION

Embodiments of the present disclosure provide a gate driving circuit and a display device, to avoid power consumption arising from overlapping of voltages output by the output ends of gate drivers in the case that the gate driving circuit is configured with a plurality of clock signals.

The present disclosure provides a gate driving circuit, including: a plurality of gate scan lines and N cascaded gate drivers; wherein an output end of a m-th stage gate driver is connected with one end of a m-th stage gate scan line and configured to provide a gate scan signal; and the output end of the m-th stage gate driver is further connected with a reset end of a (m−1)-th stage gate driver and configured to provide a reset signal, wherein N and m are positive integers, and m<N.

Detailed description of the technical solutions according to the embodiments of the present disclosure will be given below.

Figure 1:
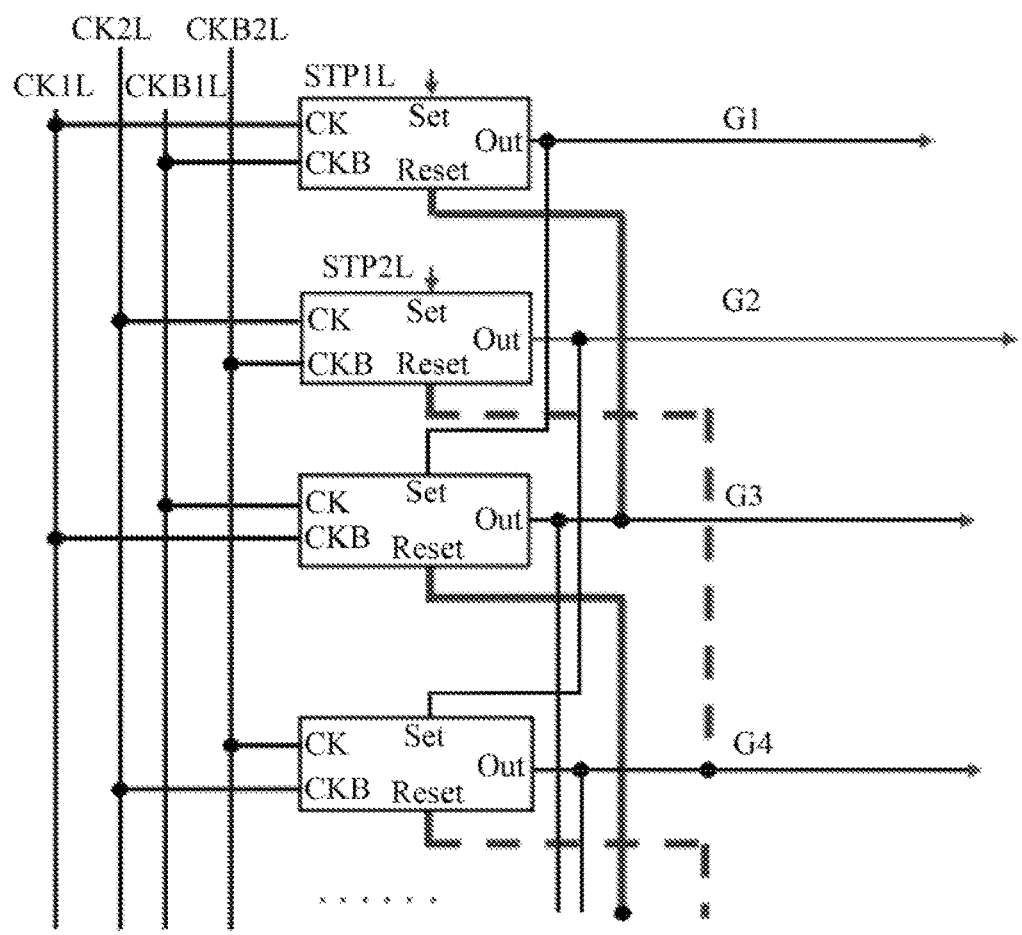
FIG. 1 is a schematic connection diagram of a four-phase ASG circuit including gate drivers in the related art.
Figure 2:
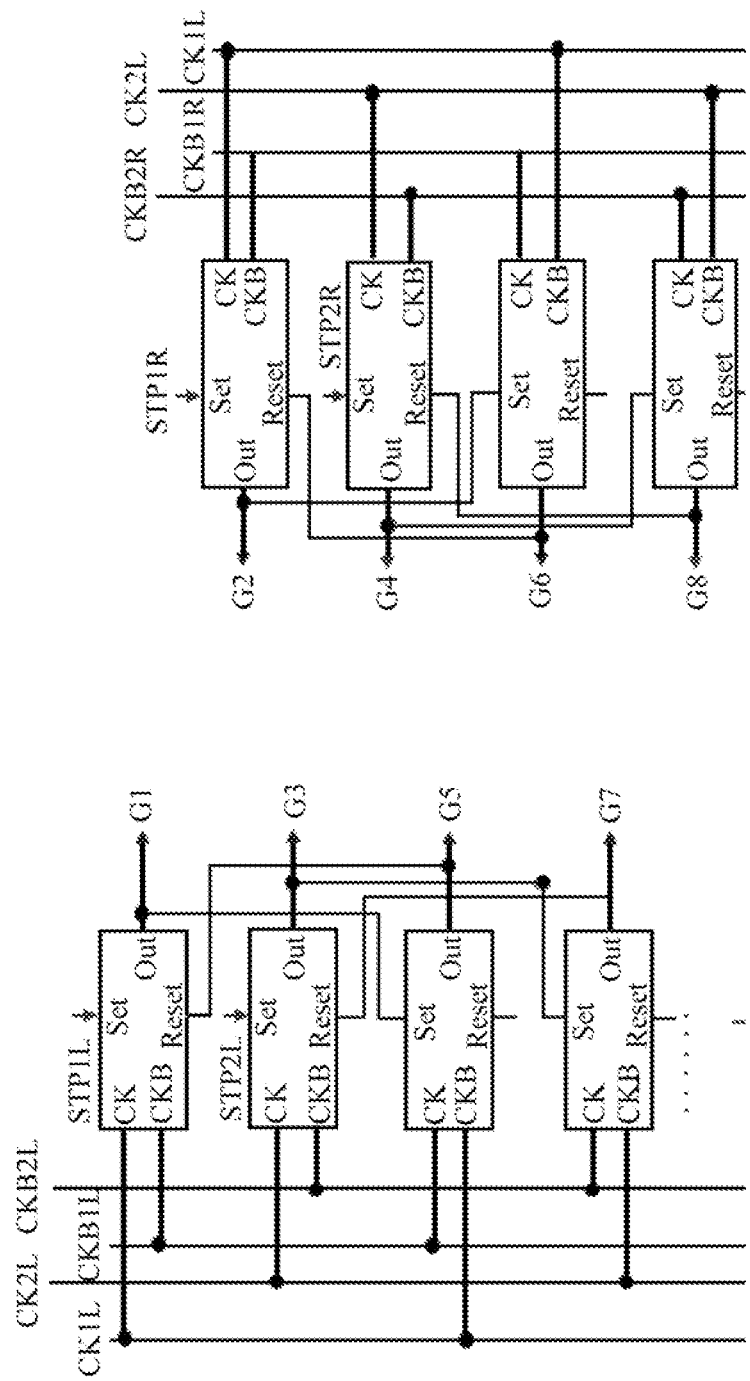
FIG. 2 is a schematic connection diagram of an eight-phase ASG circuit including gate drivers in the related art.
Figure 3:
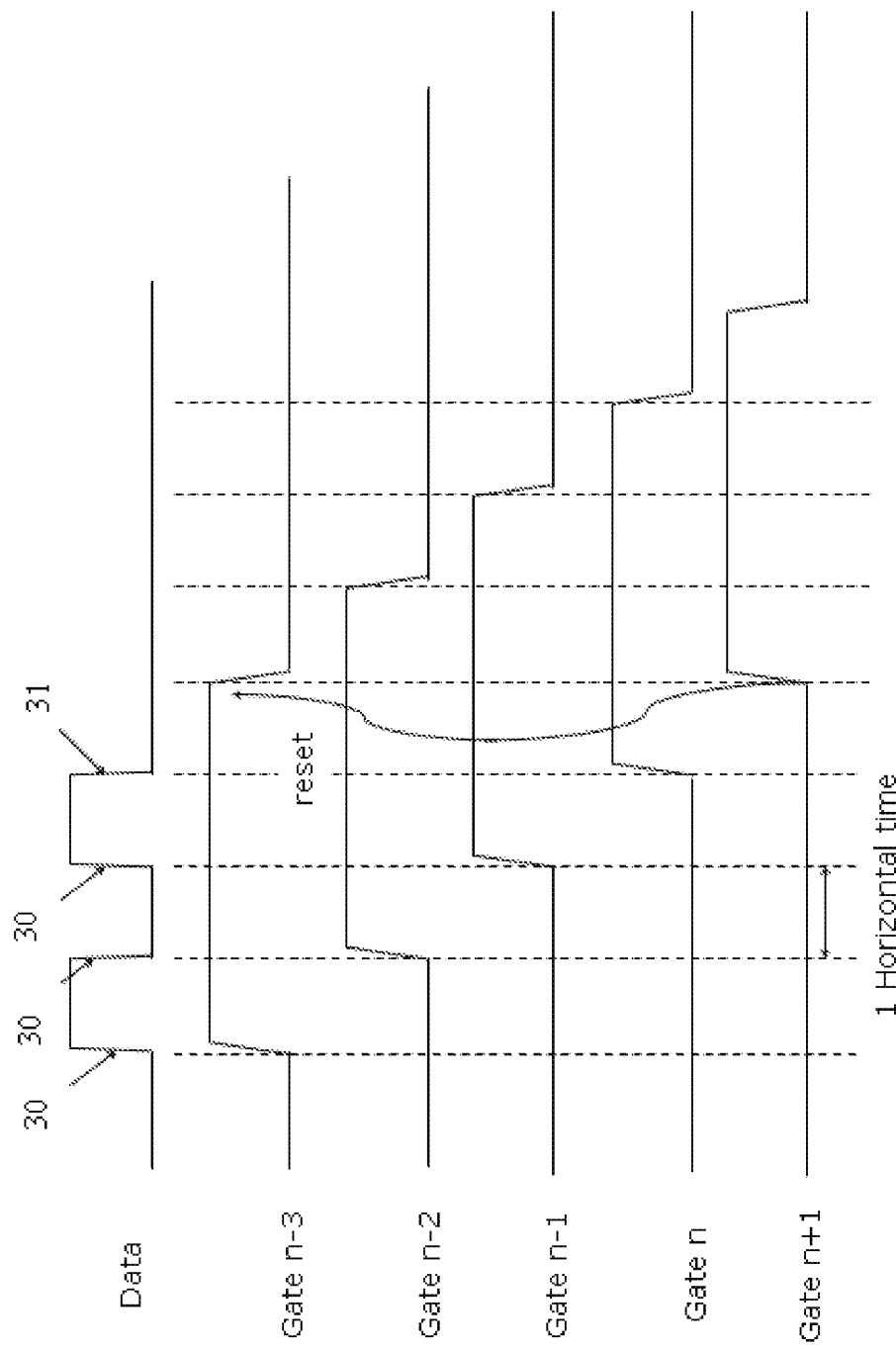
FIG. 3 is a schematic diagram of voltage signals output by the output ends of adjacent gate drivers in an eight-phase ASG circuit in the related art.
Figure 4:
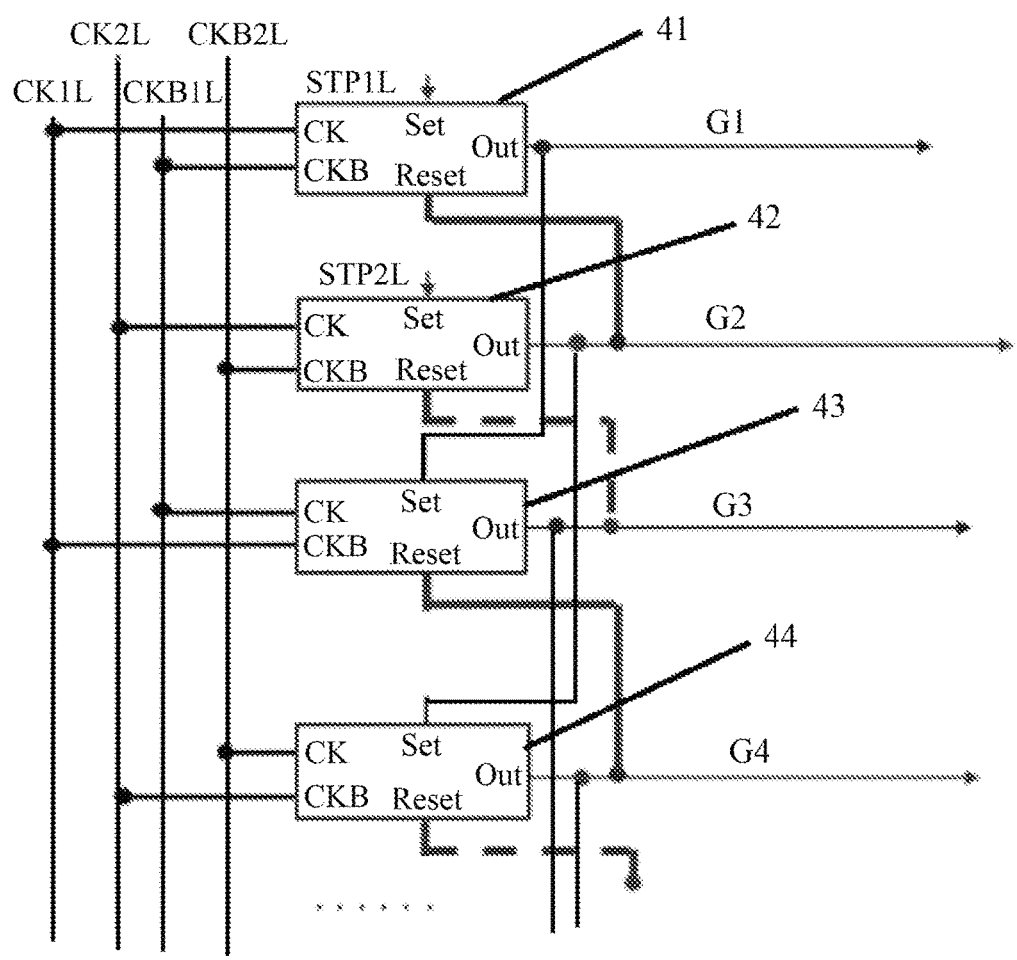
FIG. 4 is a schematic connection diagram of a four-phase ASG circuit including gate drivers according to an embodiment of the present disclosure.

As shown in FIG. 4, the gate driving circuit according to an embodiment of the present disclosure is configured with two clock signal controllers and four clock signal lines. The four clock signal lines include a first clock signal line CK1L, a second clock signal line CKB1L, a third clock signal line CK2L and a fourth clock signal line CKB2L, wherein, the first clock signal line CK1L and the second clock signal line CKB1L are clock signal lines connected with a first clock signal controller and having the same cycle and opposite phases; and the third clock signal line CK2L and the fourth clock signal line CKB2L are clock signal lines connected with a second clock signal controller and having the same cycle and opposite phases.

As shown in FIG. 4, in the embodiment of the present disclosure, the gate drivers connected with the clock signal lines controlled by the first clock signal controller are defined as a first set of gate drivers; and the gate drivers connected with the clock signal lines controlled by the second clock signal controller are defined as a second set of gate drivers. The N stages of gate drivers in the gate driving circuit according to the embodiment of the present disclosure include a first set of gate drivers in which the output end of each stage of gate divers, such as G1, G3 and the like, is electrically connected with one end of each of odd-stage gate scan lines respectively, a second set of gate drivers in which the output end of each stage of gate diver, such as G2, G4 and the like, is electrically connected with one end of each of even-stage gate scan lines respectively, a first trigger signal line STP1L and a second trigger signal line STP2L; wherein a trigger signal input end of a first-stage gate driver 41 in the first set is connected with the first trigger signal line STP1L of the gate driving circuit, and a trigger signal input end of a first-stage gate driver 42 in the second set is connected with the second trigger signal line STP2L of the gate driving circuit; it could be seen from the figure that an output end of a m-th stage gate driver of the ASG circuit is connected with a trigger signal input end of a (m+2)-th stage gate driver, and the output end of the m-th stage gate driver is further connected with a reset signal input end of a (m−1)-th stage gate driver, for example, an output end of the second-stage gate driver 42 is connected with a reset signal input end of the first-stage gate driver 41, an output end of a third-stage gate driver 43 is connected with a reset signal input end of the second-stage gate driver 42, and an output end of a fourth-stage gate driver 44 is connected with a reset signal input end of the third-stage gate driver 43. The gate driving circuit further includes a preset dummy gate driver, and a reset signal input end of a last-stage gate driver in the gate drivers is connected with an output end of the preset dummy gate driver, wherein, reference could be made to FIG. 5 for the dummy gate driver.

As shown in FIG. 4, in the first set of gate drivers, for each odd-stage gate driver such as a first-stage gate driver 41, a first clock signal input end CK of the first-stage gate driver 41 is connected with the first clock signal line CK1L, a second clock signal input end CKB of the first-stage gate driver 41 is connected with the second clock signal line CKB1L, and for each even-stage gate driver such as a second-stage gate driver 43, a first clock signal input end CK of the second-stage gate driver 43 is connected with the second clock signal line CKB1L, and a second clock signal input end CKB of the second-stage gate driver 43 is connected with the first clock signal line CK1L. The embodiment of the present disclosure does not limit the connection between the clock signal input ends of the gate drivers in the first set and the clock signal lines, for example, in the first set the first clock signal input end CK of the first-stage gate driver 41 is connected with the second clock signal line CKB1L, and the second clock signal input end CKB of the first-stage gate driver 41 is connected with the first clock signal line CK1L; and the first clock signal input end CK of the second-stage gate driver 43 is connected with the first clock signal line CK1L, and the second clock signal input end CKB of the second-stage gate driver 43 is connected with the second clock signal line CKB1L. The first clock signal input ends of two adjacent stages of gate drivers in the first set in the embodiment of the present disclosure are connected with the clock signal lines having the same cycle and opposite phases respectively, and the second clock signal input ends of the two adjacent stages of gate drivers in the first set are connected with the clock signal lines having the same cycle and opposite phases respectively.

In the second set of gate drivers, for each odd-stage gate driver such as a first-stage gate driver 42, a first clock signal input end CK of the first-stage gate driver 42 is connected with the third clock signal line CK2L, a second clock signal input end CKB of the first-stage gate driver 42 is connected with the fourth clock signal line CKB2L, and for each even-stage gate driver such as a second-stage gate driver 44, a first clock signal input end CK of the second-stage gate driver 44 is connected with the fourth clock signal line CKB2L, and a second clock signal input end CKB of the second-stage gate driver 44 is connected with the third clock signal line CK2L. Similarly, the embodiment of the present disclosure does not limit the connection between the clock signal input ends of the gate drivers in the second set and the clock signal lines. The first clock signal input ends of two adjacent stages of gate drivers in the second set in the embodiment of the present disclosure are connected with the clock signal lines having the same cycle and opposite phases respectively, and the second clock signal input ends of the two adjacent gate drivers are connected with the clock signal lines having the same cycle and opposite phases respectively.

Figure 5:
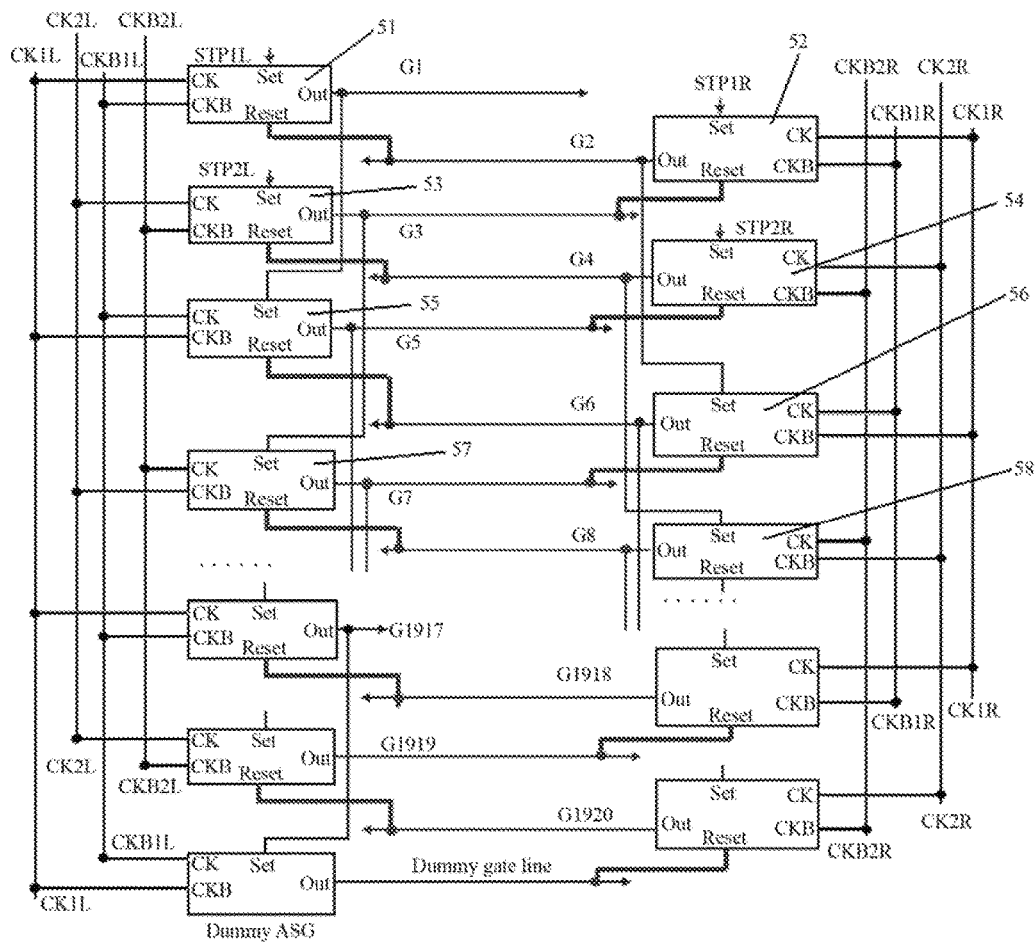
FIG. 5 is a schematic connection diagram of an eight-phase ASG circuit including gate drivers according to an embodiment of the present disclosure.

As shown in FIG. 5, the gate driving circuit according to an embodiment of the present disclosure is configured with four clock signal controllers and eight clock signal lines. The eight clock signal lines include a first clock signal line CK1L, a second clock signal line CKB1L, a third clock signal line CK1R, a fourth clock signal line CKB1R, a fifth clock signal line CK2L, a sixth clock signal line CKB2L, a seventh clock signal line CK2R and an eighth clock signal line CKB2R. Wherein, the first clock signal line CK1L and the second clock signal line CKB1L are clock signal lines connected with a first clock signal controller and having the same cycle and opposite phases; the third clock signal line CK1R and the fourth clock signal line CKB1R are clock signal lines connected with a second clock signal controller and having the same cycle and opposite phases; the fifth clock signal line CK2L and the sixth clock signal line CKB2L are clock signal lines connected with a third clock signal controller and having the same cycle and opposite phases; and the seventh clock signal line CK2R and the eighth clock signal line CKB2R are clock signal lines connected with a fourth clock signal controller and having the same cycle and opposite phases.

As shown in FIG. 5, in the embodiment of the present disclosure, the gate drivers connected with the clock signal lines controlled by the first clock signal controller are named as a first set of gate drivers; the gate drivers connected with the clock signal lines controlled by the second clock signal controller are named as a second set of gate drivers; the gate drivers connected with the clock signal lines controlled by the third clock signal controller are named as a third set of gate drivers; and the gate drivers connected with the clock signal lines controlled by the fourth clock signal controller are named as a fourth set of gate drivers. The N stages of gate drivers in the gate driving circuit according to the embodiment of the present disclosure include the first set of gate drivers in which an output end of each stage of gate drivers, such as G1, G5 and the like, is electrically connected with one end of each of a first group of gate scan lines respectively, the second set of gate drivers in which an output end of each stage of gate drivers, such as G2, G6 and the like, is electrically connected with one end of each of a second group of gate scan lines respectively, the third set of gate drivers in which an output end of each stage of gate drivers, such as G3, G7 and the like, is electrically connected with one end of each of a third group of gate scan lines respectively, and the fourth set of gate drivers in which an output end of each stage of gate drivers, such as G4, G8 and the like, is electrically connected with one end of each of a fourth group of gate scan lines respectively, a first trigger signal line STP1L, a second trigger signal line STP1R, a third trigger signal line STP2L and a fourth trigger signal line STP2R; wherein, a trigger signal input end of a first-stage gate driver 51 in the first set is connected with the first trigger signal line STP1L of the gate driving circuit, a trigger signal input end of a first-stage gate driver 52 in the second set is connected with the second trigger signal line STP1R of the gate driving circuit, a trigger signal input end of a first-stage gate driver 53 in the third set is connected with the third trigger signal line STP2L of the gate driving circuit, and a trigger signal input end of a first-stage gate driver 54 in the fourth gate driver set is connected with the fourth trigger signal line STP2R of the gate driving circuit.

As shown in FIG. 5, an output end of a m-th stage gate driver of the ASG circuit is connected with a trigger signal input end of a (m+4)-th stage gate driver, and the output end of the m-th stage gate driver is further connected with a reset signal input end of a (m−1)-th stage gate driver, for example, a reset signal input end of a first-stage gate driver 51 is connected with an output end of a second-stage gate driver 52, a reset signal input end of the second-stage gate driver 52 is connected with an output end of a third-stage gate driver 53, and a reset signal input end of the third-stage gate driver 53 is connected with an output end of a fourth-stage gate driver 54. The gate driving circuit further includes a preset dummy gate driver, and a reset signal input end of a last-stage gate driver in the gate drivers is connected with an output end of the preset dummy gate driver.

As shown in FIG. 5, in the first set, for each odd-stage gate driver such as a first-stage gate driver 51, a first clock signal input end CK of the first-stage gate driver 51 is connected with the first clock signal line CK1L, a second clock signal input end CKB of the first-stage gate driver 51 is connected with the second clock signal line CKB1L, and for each even-stage gate driver such as a second-stage gate driver 55, a first clock signal input end CK of the second-stage gate driver 55 is connected with the second clock signal line CKB1L, and a second clock signal input end CKB of the second-stage gate driver 55 is connected with the first clock signal line CK1L. The first clock signal input ends of two adjacent stages of gate drivers in the first set in the embodiment of the present disclosure are connected with the clock signal lines having the same cycle and opposite phases respectively, and the second clock signal input ends of the two adjacent gate drivers are connected with the clock signal lines having the same cycle and opposite phases respectively.

In the second set of gate drivers, for each odd-stage gate driver such as a first-stage gate driver 52, a first clock signal input end CK of the first-stage gate driver 52 is connected with the third clock signal line CK1R, a second clock signal input end CKB of the first-stage gate driver 52 is connected with the fourth clock signal line CKB1R, and for each even-stage gate driver such as a second-stage gate driver 56, a first clock signal input end CK of the second-stage gate driver 56 is connected with the fourth clock signal line CKB1R, and a second clock signal input end CKB of the second-stage gate driver 56 is connected with the third clock signal line CK1R. The first clock signal input ends of two adjacent stages of gate drivers in the second set in the embodiment of the present disclosure are connected with the clock signal lines having the same cycle and opposite phases respectively, and the second clock signal input ends of the two adjacent gate drivers are connected with the clock signal lines having the same cycle and opposite phases respectively.

In the third set of gate drivers, for each odd-stage gate driver such as a first-stage gate driver 53, a first clock signal input end CK of the first-stage gate driver 53 is connected with the fifth clock signal line CK2L, a second clock signal input end CKB of the first-stage gate driver 53 is connected with the sixth clock signal line CKB2L; and for each even-stage gate driver such as a second-stage gate driver 57, a first clock signal input end CK of the second-stage gate driver 57 is connected with the sixth clock signal line CKB2L, and a second clock signal input end CKB of the second-stage gate driver 57 is connected with the fifth clock signal line CK2L. The first clock signal input ends of two adjacent stages of gate drivers in the third set in the embodiment of the present disclosure are connected with the clock signal lines having the same cycle and opposite phases respectively, and the second clock signal input ends of the two adjacent stages of gate drivers are connected with the clock signal lines having the same cycle and opposite phases respectively.

In the fourth set of gate drivers, for each odd-stage gate driver such as a first-stage gate driver 54, a first clock signal input end CK of the first-stage gate driver 54 is connected with the seventh clock signal line CK2R, a second clock signal input end CKB of the first-stage gate driver 54 is connected with the eighth clock signal line CKB2R; and for each even-stage gate driver such as a second-stage gate driver 58, a first clock signal input end CK of the second-stage gate driver 58 is connected with the eighth clock signal line CKB2R, and a second clock signal input end CKB of the second-stage gate driver 58 is connected with the seventh clock signal line CK2R. The first clock signal input ends of two adjacent stages of gate drivers in the fourth set in the embodiment of the present disclosure are connected with the clock signal lines having the same cycle and opposite phases respectively, and the second clock signal input ends of the two adjacent stages of gate drivers are connected with the clock signal lines having the same cycle and opposite phases respectively.

Figure 6:
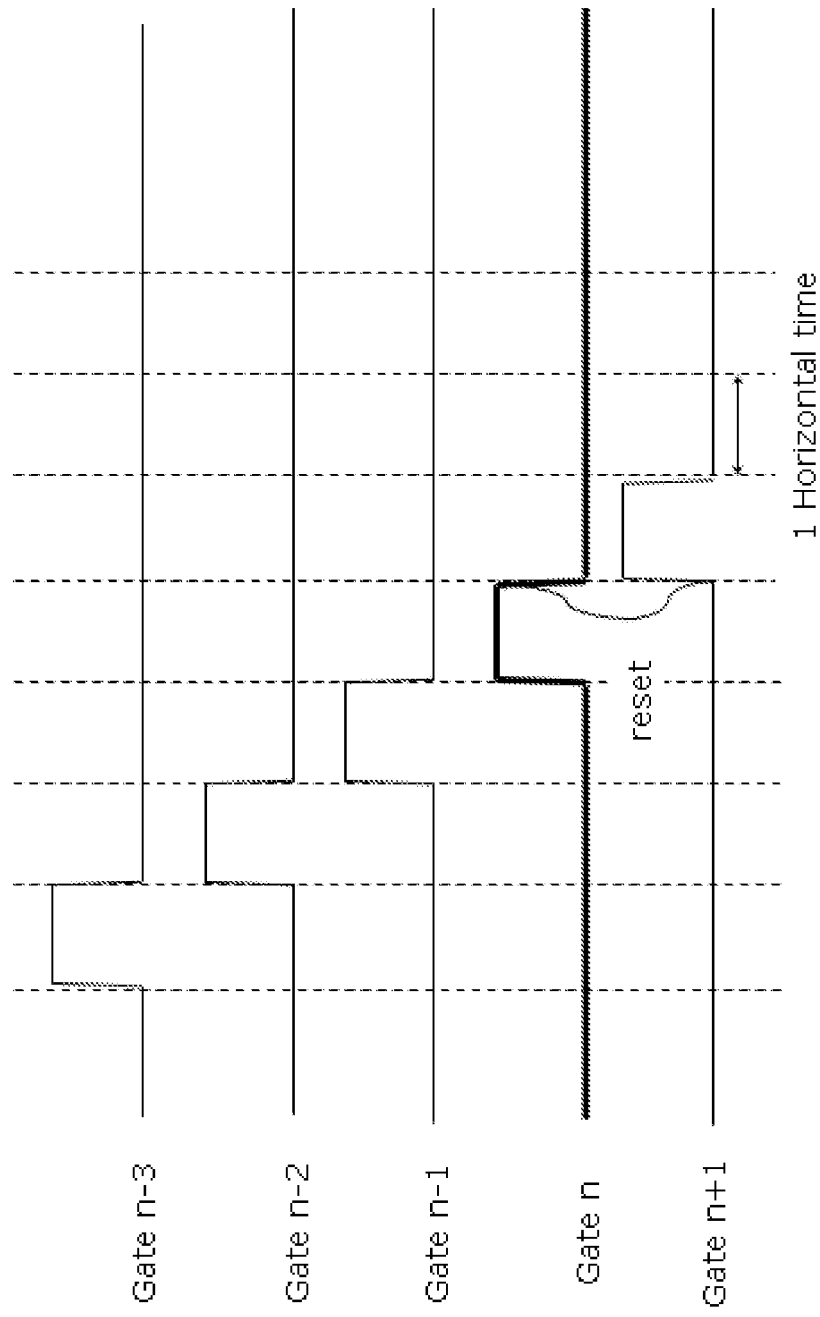
FIG. 6 is a schematic diagram of voltage signals output by the output ends of adjacent gate drivers in an eight-phase ASG circuit according to an embodiment of the present disclosure.

It could be seen from FIG. 5 that a reset end of a first-stage gate driver 51 is connected with an output end of a second-stage gate driver 52, a reset end of the second-stage gate driver 52 is connected with an output end of a third-stage gate driver 53, and so on. A reset end of each stage of gate drivers is connected with an output end of a next-stage gate driver, in this way, the next-stage gate driver can reset the previous-stage gate driver, so there is no overlapping area among the voltage signals output by respective stages. As shown in FIG. 6, unnecessary charging of pixel is eliminated and the energy consumption of the gate driving circuit is reduced due to the fact that the reset gate driver is turned off and pixels are not charged.

Figure 7:
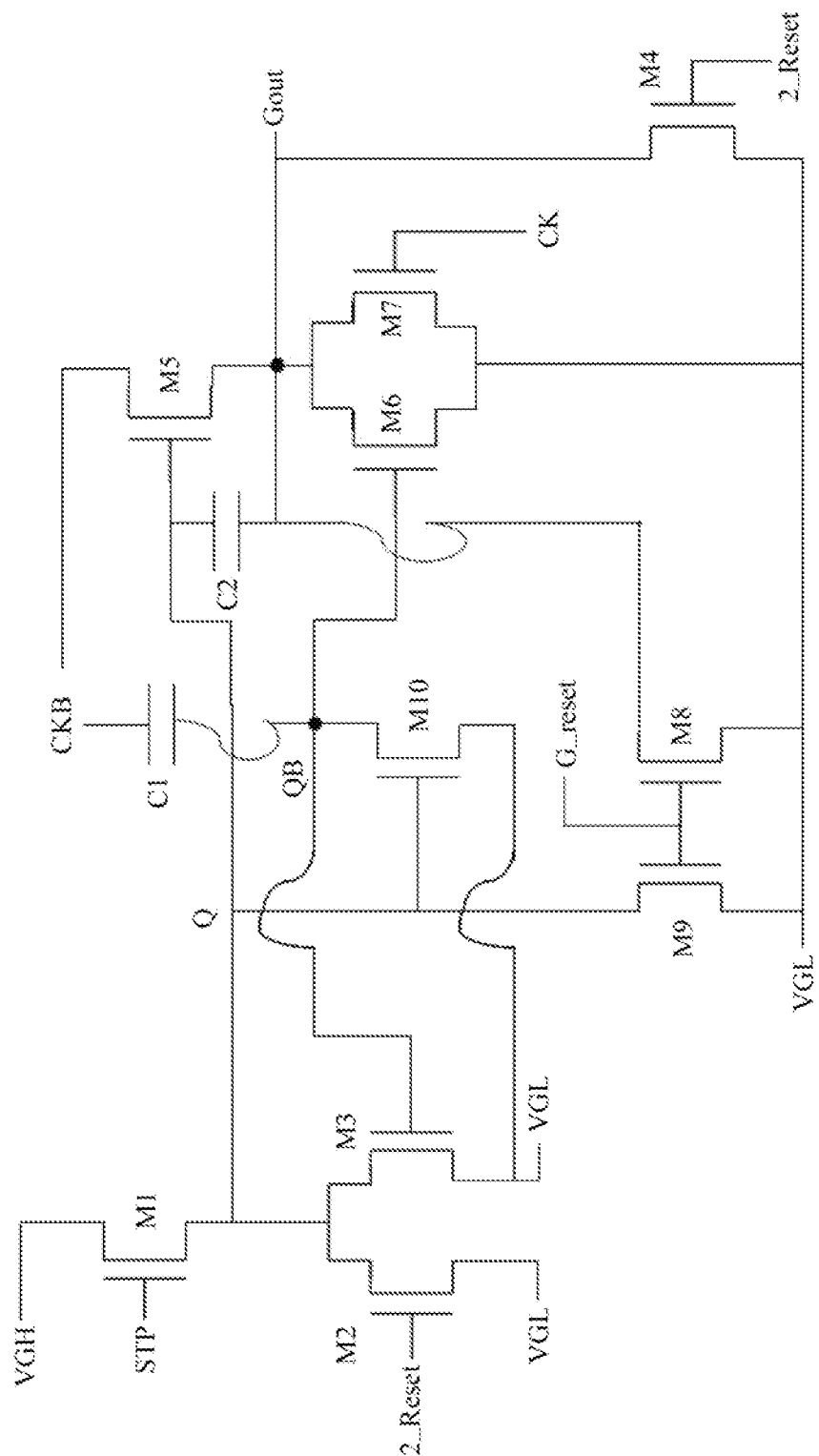
FIG. 7 is a schematic structural diagram of a gate driver according to an embodiment of the present disclosure.

As shown in FIG. 7, a gate driver according to an embodiment of the present disclosure includes a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, a first capacitor C1 and a second capacitor C2. A gate of the first transistor M1 is connected with a trigger signal input end STP, a drain of the first transistor M1 is connected with a drain of the second transistor M2, and a source of the first transistor M1 is connected with a high-level signal VGH input end; a gate of the second transistor M2 is connected with a first reset signal 2_Reset input end, and a source of the second transistor M2 is connected with a low-level signal VGL input end; a gate of the third transistor M3 is connected with a gate of the sixth transistor M6, a drain of the third transistor M3 is connected with the drain of the second transistor M2, and a source of the third transistor M3 is connected with the low-level signal VGL input end; a gate of the fourth transistor M4 is connected with the first reset signal 2_Reset input end, a source of the fourth transistor M4 is connected with the low-level signal VGL input end, and a drain of the fourth transistor M4 is connected with an output end Gout; a gate of the fifth transistor M5 is connected with one electrode of the second capacitor C2 and the drain of the first transistor M1, a drain of the fifth transistor M5 is connected with a drain of the sixth transistor M6, and a source of the fifth transistor M5 is connected with a first clock signal CKB input end; a gate of the sixth transistor M6 is connected with the gate of the third transistor M3, a source of the sixth transistor M6 is connected with the low-level signal VGL input end, and a drain of the sixth transistor is connected with a drain of the seventh transistor M7; a gate of the seventh transistor M7 is connected with a second clock signal CK input end, and a source of the seventh transistor M7 is connected with the low-level signal VGL input end; a gate of the eighth transistor M8 is connected with a second reset signal G-reset input end, a source of the eighth transistor M8 is connected with the low-level signal VGL input end, and a drain of the eighth transistor M8 is connected with the other electrode of the second capacitor C2; a gate of the ninth transistor M9 is connected with the second reset signal G-reset input end, a source of the ninth transistor M9 is connected with the low-level signal VGL input end, and a drain of the ninth transistor M9 is connected with the gate of the fifth transistor M5, a gate of the tenth transistor M10 and the drain of the first transistor M1; and the gate of the tenth transistor M10 is connected with the drain of the first transistor M1, a source of the tenth transistor M10 is connected with the low-level signal VGL input end, and a drain of the tenth transistor M10 is connected with one electrode of the first capacitor C1, the other electrode of the first capacitor C1 is connected with the first clock signal CKB input end. Referring to FIG. 7, a solid dot represents an intersection node between two intersecting lines, and a curved segment represents that two intersecting lines are not connected to each other.

In an embodiment, an output end of a m-th stage gate driver is electrically connected with a first reset signal 2_Reset input end of a (m−1)-th stage gate driver, and a second reset signal G-reset simultaneously provides reset signals for the whole gate driving circuit in a period of one frame.

Figure 8:
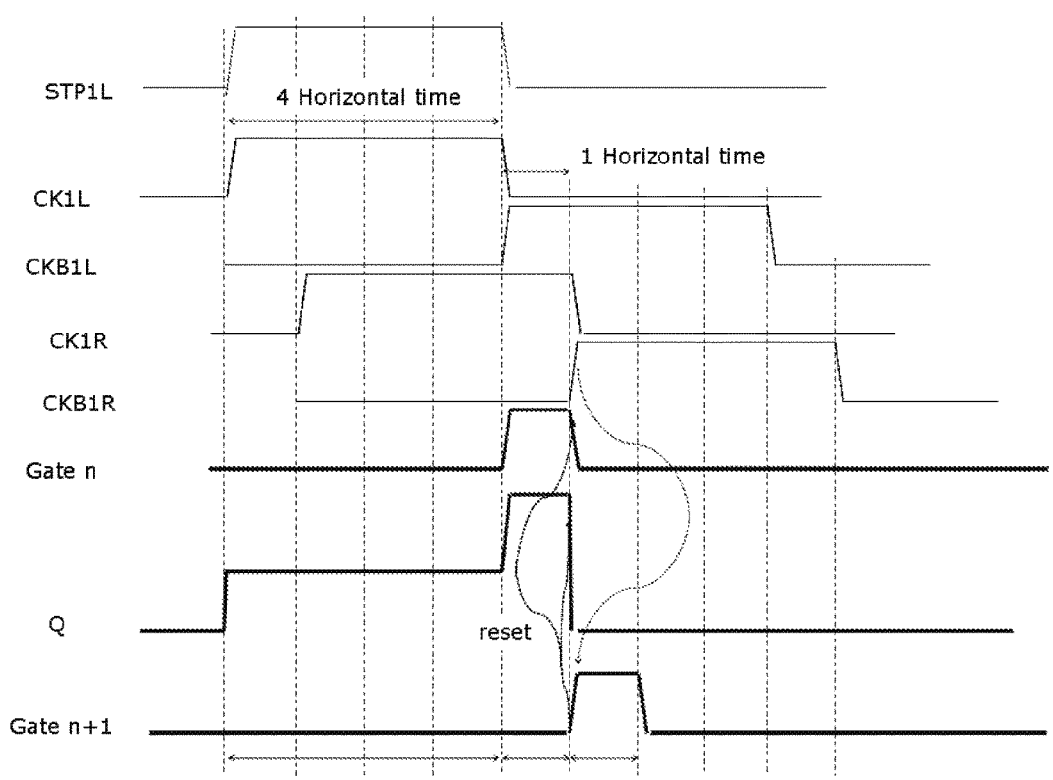
FIG. 8 is a timing diagram of the gate driver according to an embodiment of the present disclosure.

FIG. 8 is a time sequence diagram of a circuit according to the above-described embodiments. Because the gate driving circuit of FIG. 5 is configured with four clock signal controllers and eight clock signal lines, each clock cycle includes high levels of four horizontal time units and low levels of four horizontal time units, wherein, two adjacent stages of gate drivers in the first set or the second set are taken as an example for illustrating a process of resetting the previous-stage gate driver by the next-stage gate driver. The signal outputted from the first trigger signal line STP1L is of high level, the signal outputted from the first clock signal line CK1L is of high level VGH, and the first transistor M1 and the seventh transistor M7 are turned on to charge the second capacitor C2, that is, a pull-up node Q is charged for the first time; when the signal outputted from the first trigger signal line STP is of low level VGL and the signal outputted from the first clock signal line CK1L is of low level, the first transistor M1 and the seventh transistor M7 are turned off, the fifth transistor M5 is turned on due to that the voltage of pull-up node Q is still of VGH, the signal outputted from the second clock signal line CKB1L is of high level VGH, thus two ends of the second capacitor C2 are recharged via the fifth transistor M5, then the pull-up node Q is recharged, and an output end Gate n of a n-th stage gate driver in the first set of gate drivers outputs high level. Within the second horizontal time of the second clock cycle, the signal outputted from the fourth clock signal line CKB1R is of high level VGH, and an output end Gate n+1 of a (n+1)-th stage gate driver in the second set of gate drivers outputs high level VGH; because the output end of the (n+1)-th stage gate driver in the gate driving circuit is connected with a reset end of a n-th stage gate driver, when the output end Gate n+1 of the (n+1)-th stage gate driver outputs the high level VGH, that is, the first reset signal 2_Reset in FIG. 7 is a high-level signal, the second transistor M2 and the fourth transistor M4 in FIG. 7 are turned on, the pull-up node Q is pulled to low level due to that the source of the second transistor M2 is connected with the low-level VGL signal input end, and the voltage of the second capacitor C2 connected with the pull-up node Q is reduced; meanwhile, because the source of the fourth transistor M4 is further connected with the low-level signal VGL input end, at this moment, the output end Gate n of the n-th stage gate driver connected with the second capacitor C2 and the drain of the fourth transistor M4 outputs low voltage, in this way, the previous-stage gate driver is reset by the next-stage gate driver.

Figure 9:
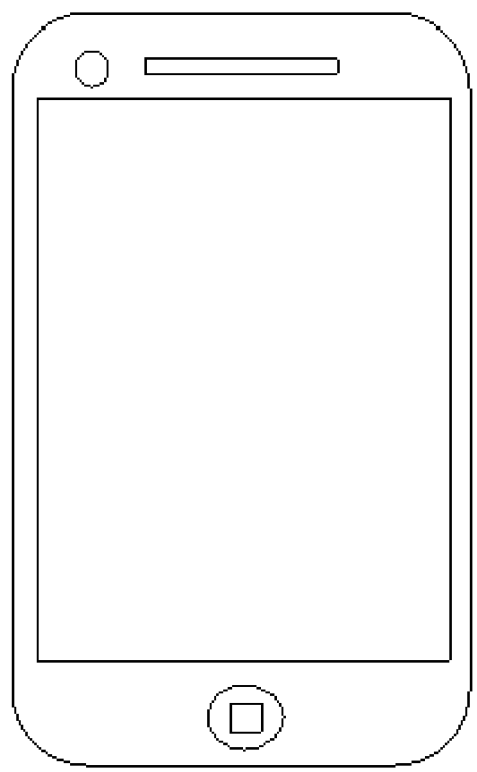
FIG. 9 is a simplified block diagram of a display device according to an embodiment of the present disclosure.

An embodiment of the present disclosure further provides a display device, including the above-mentioned gate driving circuit. The display device according to the embodiment of the present disclosure may be a mobile phone, as shown in FIG. 9, or a computer, a liquid crystal television and the like.

Obviously, various modifications and variations could be made to the present disclosure by those skilled in the art without departing from the spirit and scope of the present disclosure. Thus, provided that these modifications and variations made to the present disclosure are within the scope of the claims of the present disclosure and equivalent technologies thereof, the present disclosure is intended to cover these modifications and variations.

What is claimed is:

1. A gate driving circuit, comprising:
a plurality of gate scan lines; and
N stages of gate drivers connected in cascade, each stage of gate drivers comprising only one trigger signal input end configured to receive only one trigger signal, a first clock input end and a second clock input end, a reset signal input end, and an output end configured to provide a gate scan signal to a corresponding gate scan line;
wherein, the output end of a m-th-stage gate driver is configured to provide a reset signal to the reset signal input end of a (m−1)-th stage gate driver,
the output end of the m-th stage gate driver is connected with the trigger signal input end of a (m+2)-th stage gate driver to provide the only one trigger signal,
N and m being positive integers, and m<N, and
the first clock input end and the second clock input end receive two clock signals having a same cycle and opposite phases,
wherein the N stages of gate drivers comprise a first set of gate drivers, a second set of gate drivers, a plurality of clock signal lines,
wherein the plurality of clock signal lines comprise a first clock signal line, a second clock signal line, a third clock signal line, and a fourth clock signal line,
in the first set of gate drivers, the first clock signal input ends of odd-numbered stages of gate drivers are connected with the first clock signal line, the second clock signal input ends of the odd-numbered stages of gate driver are connected with the second clock signal line, the first clock signal input ends of even-numbered stages of gate driver are connected with the second clock signal line, and the second clock signal input ends of the even-numbered stages of gate driver are connected with the first clock signal line, and
in the second set of the gate drivers, the first clock signal input ends of odd-numbered stages of gate driver are connected with the third clock signal line, the second clock signal input ends of the odd-numbered stages of gate driver are connected with the fourth clock signal line, the first clock signal input ends of even-numbered stages of gate driver are connected with the fourth clock signal line, and the second clock signal input ends of the even-numbered stages of gate drivers are connected with the third clock signal line.

2. The gate driving circuit according to claim 1, wherein the N stages of gate drivers further comprise a first trigger signal line, and a second trigger signal line; wherein the trigger signal input end of a first-stage gate driver in the first set is connected with the first trigger signal line to receive the only one trigger signal of the first-stage gate driver in the first set, and the trigger signal input end of a first-stage gate driver in the second set is connected with the second trigger signal line to receive the only one trigger signal of the first-stage gate driver in the second set; the output end of the m-th stage gate driver is connected with the trigger signal input end of a (m+2)-th stage gate driver to provide the only one trigger signal of the (m+2)-th stage gate driver, and the output end of the m-th-stage gate driver is further connected with the reset signal input end of the (m−1)-th stage gate driver;

the gate driving circuit further comprises a preset dummy gate driver, wherein the reset signal input end of a last-stage gate driver is connected with an output end of the preset dummy gate driver.

3. The gate driving circuit according to claim 1, wherein
the first clock signal line and the second clock signal line are clock signal lines connected with a first clock signal controller, and having a same cycle and opposite phases; and
the third clock signal line and the fourth clock signal line are clock signal lines connected with a second clock signal controller and having a same cycle and opposite phases.

4. A gate driving circuit, comprising:
a plurality of gate scan lines; and
N stages of gate drivers connected in cascade, each stage of gate drivers comprises only one trigger signal input end configured to receive only one trigger signal, a first clock input end and a second clock input end, a reset signal input end, and an output end configured to provide a gate scan signal to a corresponding gate scan line, and the first clock input end and the second clock input end receive two clock signals having a same cycle and opposite phases,
wherein the N stages of gate drivers comprise a first set of gate drivers, a second set of gate drivers, a third set of gate drivers, a fourth set of gate drivers, a plurality of clock signal lines, a first trigger signal line, a second trigger signal line, a third trigger signal line, and a fourth trigger signal line;
wherein, the trigger signal input end of a first-stage gate driver in the first set is connected with the first trigger signal line to receive the only one trigger signal of the first-stage gate driver in the first set, the trigger signal input end of a first-stage gate driver in the second set is connected with the second trigger signal line to receive the only one trigger signal of the first-stage gate driver in the second set, the trigger signal input end of a first-stage gate driver in the third set is connected with the third trigger signal line to receive the only one trigger signal of the first-stage gate driver in the third set, the trigger signal input end of a first-stage gate driver in the fourth set is connected with the fourth trigger signal line to receive the only one trigger signal of the first-stage gate driver in the fourth set;

the output end of the m-th stage gate driver is connected with the trigger signal input end of a (m+4)-th stage gate driver to provide the only one trigger signal of the (m+4)-th stage gate driver, and the output end of the m-th stage gate driver is further connected with the reset signal input end of a (m−1)-th stage gate driver, N and m being positive integers, and m<N;

the gate driving circuit further comprising a preset dummy gate driver, wherein the reset signal input end of a last-stage gate driver in the gate drivers is connected with an output end of the preset dummy gate driver.

5. The gate driving circuit according to claim 4, wherein the clock signal lines comprise a first clock signal line, a second clock signal line, a third clock signal line, a fourth clock signal line, a fifth clock signal line, a sixth clock signal line, a seventh clock signal line, and an eighth clock signal line;

in the first set of gate drivers, the first clock signal input ends of odd-numbered stages of gate drivers are connected with the first clock signal line, the second clock signal input ends of the odd-numbered stages of stages gate drivers are connected with the second clock signal line, the first clock signal input ends of even-numbered stages of gate drivers are connected with the second clock signal line, and the second clock signal input ends of the even-numbered stages of gate drivers are connected with the first clock signal line;

in the second set of gate drivers, the first clock signal input ends of odd-numbered stages of gate drivers are connected with the third clock signal line, the second clock signal input ends of the odd-numbered stages of gate drivers are connected with the fourth clock signal line, the first clock signal input ends of even-numbered stages of gate drivers are connected with the fourth clock signal line, and the second clock signal input ends of the even-numbered stages of gate drivers are connected with the third clock signal line;

in the third set of gate drivers, the first clock signal input ends of odd-numbered stages of gate drivers are connected with the fifth clock signal line, the second clock signal input ends of the odd-numbered stages of gate drivers are connected with the sixth clock signal line, the first clock signal input ends of even-numbered stages of gate drivers are connected with the sixth clock signal line, and the second clock signal input ends of the even-numbered stages of gate drivers are connected with the fifth clock signal line;

in the fourth set of gate drivers, the first clock signal input ends of odd-numbered stages of gate drivers are connected with the seventh clock signal line, the second clock signal input ends of the odd-numbered stages of gate drivers are connected with the eighth clock signal line, the first clock signal input ends of even-numbered stages of gate drivers are connected with the eighth clock signal line, and the second clock signal input ends of the even-numbered stages of gate drivers are connected with the seventh clock signal line.

6. The gate driving circuit according to claim 5, wherein the first clock signal line and the second clock signal line are clock signal lines connected with a first clock signal controller and having a same cycle and opposite phases; the third clock signal line and the fourth clock signal line are clock signal lines connected with a second clock signal controller and having a same cycle and opposite phases; the fifth clock signal line and the sixth clock signal line are clock signal lines connected with a third clock signal controller and having a same cycle and opposite phases; and the seventh clock signal line and the eighth clock signal line are clock signal lines connected with a fourth clock signal controller and having a same clock cycle and opposite phases.

7. A gate driving circuit, comprising:
a plurality of gate scan lines; and
N stages of gate drivers connected in cascade, each stage of gate drivers comprising a reset signal input end and an output end configured to provide a gate scan signal to a corresponding gate scan line;
wherein, the output end of a m-th-stage gate driver is configured to provide a reset signal to the reset signal input end of a (m−1)-th stage gate driver,
N and m being positive integers, and m<N,
wherein each stage of gate drivers comprises a first transistor, a second transistor, a third transistor, a fourth transistor, a fifth transistor, a sixth transistor, a seventh transistor, an eighth transistor, a ninth transistor, a tenth transistor, a first capacitor, and a second capacitor;
a gate of the first transistor is connected with a trigger signal input end, a drain of the first transistor is connected with a drain of the second transistor, and a source of the first transistor is connected with a high-level signal input end;
a gate of the second transistor is connected with a first reset signal input end, and a source of the second transistor is connected with a low-level signal input end;
a gate of the third transistor is connected with a gate of the sixth transistor, a drain of the third transistor is connected with the drain of the second transistor, and a source of the third transistor is connected with the low-level signal input end;
a gate of the fourth transistor is connected with the first reset signal input end, a source of the fourth transistor is connected with the low-level signal input end, and a drain of the fourth transistor is connected with the output end;
a gate of the fifth transistor is connected with a first electrode of the second capacitor and the drain of the first transistor, a drain of the fifth transistor is connected with a drain of the sixth transistor, and a source of the fifth transistor is connected with a first clock signal input end;
a gate of the sixth transistor is connected with the gate of the third transistor, a source of the sixth transistor is connected with the low-level signal input end, and a drain of the sixth transistor is connected with a drain of the seventh transistor;
a gate of the seventh transistor is connected with a second clock signal input end, and a source of the seventh transistor is connected with the low-level signal input end;
a gate of the eighth transistor is connected with a second reset signal input end, a source of the eighth transistor is connected with the low-level signal input end, and a drain of the eighth transistor is connected with a second electrode of the second capacitor;
a gate of the ninth transistor is connected with the second reset signal input end, a source of the ninth transistor is connected with the low-level signal input end, and a drain of the ninth transistor is connected with the gate of the fifth transistor, a gate of the tenth transistor and the drain of the first transistor;
the gate of the tenth transistor is connected with the drain of the first transistor, a source of the tenth transistor is connected with the low-level signal input end, and a drain of the tenth transistor is connected with a first electrode of the first capacitor, a second electrode of the first capacitor is connected with the first clock signal input end.

8. The gate driving circuit according to claim 7, wherein the output end of the m-th stage gate driver is electrically connected with the reset signal input end of the (m−1)-th stage gate driver.

9. A display device, comprising a gate driving circuit, wherein the gate driving circuit comprises:
a plurality of gate scan lines; and
N stages of gate drivers connected in cascade, each stage of gate drivers comprising only one trigger signal input end configured to receive only one trigger signal, a first clock input end and a second clock input end, a reset signal input end, and an output end configured to provide a gate scan signal to a corresponding gate scan line;
wherein, the output end of a m-th-stage gate driver is configured to provide a reset signal to the reset signal input end of a (m−1)-th stage gate driver,
the output end of the m-th stage gate driver is connected with the trigger signal input end of a (m+2)-th stage gate driver to provide the only one trigger signal,
N and m being positive integers, and m<N,
the first clock input end and the second clock input end receive two clock signals having a same cycle and opposite phases,
wherein the N stages of gate drivers comprise a first set of gate drivers, a second set of gate drivers, a plurality of clock signal lines,
wherein the plurality of clock signal lines comprise a first clock signal line, a second clock signal line, a third clock signal line, and a fourth clock signal line,
in the first set of gate drivers, the first clock signal input ends of odd-numbered stages of gate drivers are connected with the first clock signal line, the second clock signal input ends of the odd-numbered stages of gate driver are connected with the second clock signal line, the first clock signal input ends of even-numbered stages of gate driver are connected with the second clock signal line, and the second clock signal input ends of the even-numbered stages of gate driver are connected with the first clock signal line, and
in the second set of the gate drivers, the first clock signal input ends of odd-numbered stages of gate driver are connected with the third clock signal line, the second clock signal input ends of the odd-numbered stages of gate driver are connected with the fourth clock signal line, the first clock signal input ends of even-numbered stages of gate driver are connected with the fourth clock signal line, and the second clock signal input ends of the even-numbered stages of gate drivers are connected with the third clock signal line.

* * * * *